(12) United States Patent
Ramesh et al.

(10) Patent No.: US 6,856,127 B1
(45) Date of Patent: Feb. 15, 2005

(54) OSCILLOSCOPE-BASED AUTOMATIC FINDER FOR LOCATING HIGH POWER DISSIPATION AREAS IN SWITCH-MODE POWER SUPPLY (SMPS) SWITCHING DEVICES

(75) Inventors: P. E. Ramesh, Bangalore (IN); Srikrishna H. Nadig, Bangalore (IN); Roger Lo, Taipei (TW)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/628,023

(22) Filed: Jul. 25, 2003

(51) Int. Cl.[7] .............................................. G01R 22/00
(52) U.S. Cl. ............................ 324/102; 702/60; 702/68
(58) Field of Search ........................ 324/76.11, 76.12, 324/76.15, 102; 702/57, 60, 61, 64–68

*Primary Examiner*—Evan Pert
(74) *Attorney, Agent, or Firm*—Moser, Patterson & Sheridan LLP (57) ABSTRACT

A method and apparatus for identifying and analyzing high power dissipation peaks across a switching device. The method and apparatus include processing voltage waveform data associated with a switching device to determine switching edge and slope parameters for each of a plurality of switching cycles, and identifying those portions of the voltage waveform data associated with switch state transition portions of the plurality of switching cycles. For a plurality of the identified switch state transition portions, respective peak power levels are calculated using portions of the voltage waveform data temporally corresponding to the plurality of identified switch state transitions, and portions of current waveform data associated with the switching device temporally corresponding to the plurality of identified switch state transitions.

20 Claims, 7 Drawing Sheets

OSCILLOSCOPE-BASED AUTOMATIC FINDER FOR LOCATING HIGH POWER DISSIPATION AREAS IN SWITCH-MODE POWER SUPPLY (SMPS) SWITCHING DEVICES

FIELD OF THE INVENTION

The present invention generally relates to circuit testing equipment, and more specifically to detecting high-power dissipation in switch-mode power supply switching devices.

BACKGROUND OF THE INVENTION

To meet the requirements of the computer and telecommunications industries, power supply technology is moving In a direction of increased switching frequency and reduced form factor. Circuit designers depend on distributed power architecture to support low-voltage processors by bringing power supplies closer to the processor. As the power demands of various circuits increase, power dissipation becomes a significant obstacle to improving circuit efficiency. Therefore, analyzing such power dissipation to contain power losses is highly desirable.

The primary function of the power supply is to provide a predetermined constant output voltage against the variation of input voltage, as well as the dynamically changing output load. The current flowing through the switching device may vary significantly, due to output load, operating temperature, and surge current. Specifically, the switching device is subjected to high current levels during the process of load regulation. The load regulation process undergoes several switching cycles before reaching a steady-state condition. Moreover, the switching device is subjected to maximum power dissipation during the switching cycle from an "ON" state to an "OFF" state and from the OFF state to the ON state. Therefore, power-supply circuit designers would attempt to optimize the switching circuit of the switch-mode power supply by reducing the switching current and minimizing the power loss associated with such switching current, as well as ensure that the switching device does not experience a "break even" value of instantaneous power, which could potentially damage the switching device.

In order to optimize the switching circuits of switch-mode power supplies (SMPS), there is a need in the art for the circuit designers to monitor the instantaneous power during the regulation process.

SUMMARY OF THE INVENTION

The disadvantages heretofore associated with the prior art are overcome by the present invention of a method and apparatus for identifying and analyzing high power dissipation peaks across a switching device. The method and apparatus include processing voltage waveform data associated with a switching device to determine switching edge and slope parameters for each of a plurality of switching cycles, and identifying those portions of the voltage waveform data associated with switch state transition portions of the plurality of switching cycles.

For a plurality of the identified switch state transition portions, respective peak power levels are calculated using portions of the voltage waveform data temporally corresponding to the plurality of identified switch state transitions, and portions of current waveform data associated with the switching device temporally corresponding to the plurality of identified switch state transitions.

BRIEF DESCRIPTION OF THE DRAWINGS

The teachings of the present invention can be readily understood by considering the following detailed descriptions in conjunction with the accompanying drawings, in which.

To facilitate understanding, identical reference numerals have been used, where possible, to designate identical elements that are common to the drawings.

DETAILED DESCRIPTION OF THE INVENTION

The present invention comprises a method for processing acquired voltage waveform data associated with a switching device, illustratively of a switching power supply, to determine switching edge and slope parameters for each of a plurality of switching cycles. Specifically, the present invention identifies those portions of a voltage waveform data associated with switch-state transition portions of the plurality of switching cycles and calculates, for a plurality of the identified switch-state transition portions, respective peak power levels using portions of the voltage waveform data temporally corresponding to the plurality of identified switch-state transitions, and portions of current waveform data associated with the switching device temporally corresponding to the plurality of identified switch-state transitions.

The present invention is discussed in terms of a power measurement software tool, such as a TDSWR2 power measurement tool produced by Tektronix, Inc. of Beaverton, Oreg. The exemplary power-measurement program tool is installed (i.e., stored) in a digitizing test and measurement device, such as a digital storage oscilloscope (DSO) (e.g., a Tektronix, Inc. model TDS5000, TDS7000, CSA7000, or TDS6000 or other DSO/acquisition devices to transform the DSO into an analysis tool that quickly measures and analyzes power dissipation in power-supply switching devices and magnetic components. The DSO using the present invention optionally generates detailed test reports in customizable formats. However, one skilled in the art will appreciate that the teachings discussed herein may be implemented in other digitizing measurement devices.

Figure 1:
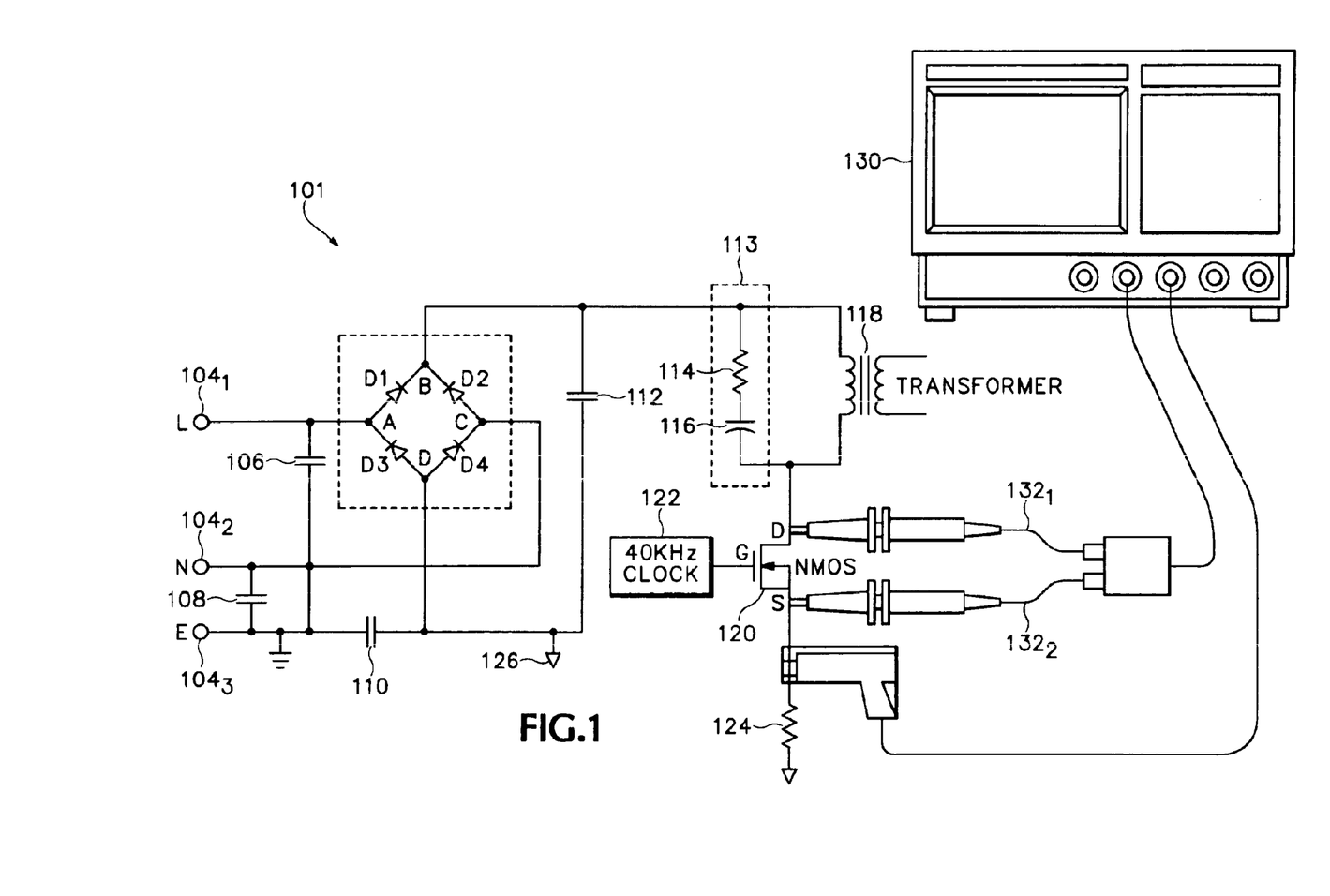
FIG. 1 depicts a schematic diagram of an exemplary switching power supply having a switching device being measured by an oscilloscope of the present invention.

FIG. 1 depicts a schematic diagram of an exemplary switching power supply circuit 101 having a switching device 120 being measured by an oscilloscope 130 of the present invention. In particular, the exemplary switching power supply 101 comprises a bridge rectifier 102 (drawn in phantom), a plurality of inputs $104_1$, to $104_3$ (collectively, inputs 104), an RC circuit 113, a switching transformer 118, a switching device 120 such as an NMOS transistor, and a clock 122. The bridge rectifier 102 comprises four diodes D1 through D4, where the anode of the D1 diode is coupled to a first input 104, at node A, and the cathode of D1 is coupled to the cathode of the second diode D2 at node B. The a node of the second diode D2 is coupled to the cathode of the fourth diode D4 at node C, while the anode of the fourth diode D4 is coupled to the anode of a third diode D3 and node D. The cathode of the third diode D3 is coupled to node A, and a second input $104_2$ is coupled to node C.

A third input line $104_3$ is coupled to ground 126, and nodes A, B, C, and D are also coupled to ground 126 via capacitors 106, 112, 108, and 110, respectively. The output of the bridge rectifier at node B is further coupled to the RC circuit 113, which comprises serially coupled resistor R14 and capacitor 116. The RC circuit is coupled in parallel with the primary windings of the switching transformer 118. The secondary windings of the switching transformer 118 are coupled to a load (not shown).

The switching device 120, illustratively an NMOS transistor, has a drain serially coupled to capacitor 116 of the RC circuit 113, a source coupled to ground 126 via resistor 124, and a gate coupled to a pulse width modulation (PWM) gate drive, such a 40 kilohertz clock 122. The oscilloscope of 130 of the present invention is coupled across the drain and source of the NMOS transistor via probes $132_1$ and $132_2$ to measure the switching cycles occurring as the transistor turns on and off.

During operation, in the instance where the power supply 101 is subjected to a sudden power demand spike or a sudden change in load, the switching device 120 is subjected to increasingly high current during the process of load regulation, which includes multiple switching cycles before reaching a steady state. An oscilloscope 130 according to an embodiment of the present invention automatically locates the peak values of the instantaneous power during each switching cycle. That is, the oscilloscope 130 identifies each switching event and analyzes the peak values of the instantaneous power during the transition from the on-state to the off-state of the switching device 120. Once the values of the instantaneous power during each switching cycle have been identified and analyzed, the switching period and energy loss for any of the cycles can be computed. The oscilloscope 130 then links the measured peak power value to the power waveform on the oscilloscope 130, such that the voltage waveform data, current waveform data, and base or gate drive waveform data can be analyzed simultaneously. The base or gate drive signal may then be adapted in a manner tending to avoid or reduce undesired power spikes or profiles, thereby reducing damage/stress on the switching device 120. It is noted that the exemplary power supply circuit 101 is illustratively shown to provide a better understanding of the Invention. Accordingly, the circuit 101 shown in FIG. 1 does not form a part of the inventive digital storage measuring device 130, and should not be considered as limiting the present invention.

Figure 2:
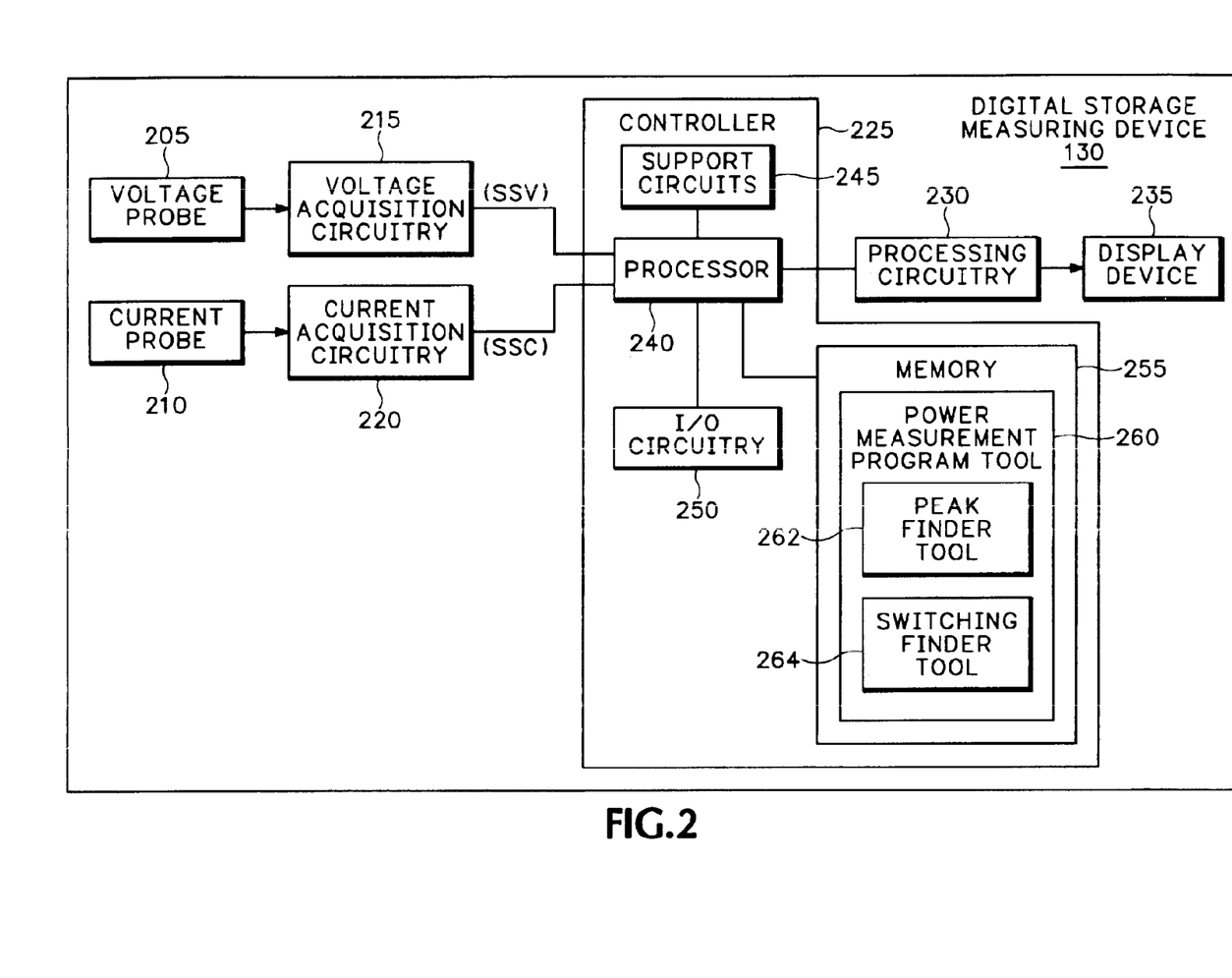
FIG. 2 depicts a high level block diagram of the oscilloscope of FIG. 1 having a power measurement tool of the present invention.

FIG. 2 depicts a high level block diagram of the oscilloscope 130 of FIG. 1 having a power measurement tool 260 of the present invention. In particular, the exemplary oscilloscope 130 of the present invention utilizes a voltage probe 205 and a current probe 210, and comprises voltage acquisition circuitry 215, current acquisition circuitry 220, a controller 225, processing circuitry 230, and a display device 235. The voltage probe 205 and current probe 210 may be any conventional voltage or current probes suitable for respectively detecting analog voltage and current signals from the exemplary switching device 120.

For example, the probes 205 and 210 may be provided by Tektronix, Inc., such as active probe model numbers P5205, TCP202, among others, which may be used to acquire real time signal information. However, one skilled in the art will appreciate that other conventional voltage and current probes may also be utilized to detect voltage and current signals from a particular element in a circuit. The output of the voltage probe 205 and current probe 210 are respectively sent to the voltage 215 and current 220 acquisition circuitry.

The voltage acquisition circuitry 215 and current acquisition circuitry 220 each comprise, Illustratively, analog-to-digital conversion circuitry, triggering circuitry, decimator circuitry, supporting acquisition memory, and the like. Acquisition circuitry 215 and 220 operate to digitize, at a sample rate, "S", one or more of the signals under test to produce one or more respective acquired sample streams suitable for use by the controller 225 and/or the processing circuitry 230. The acquisition circuitry 215 and 220, In response to commands received from the controller 225, change trigger conditions, decimator functions, and other acquisition related parameters. The acquisition circuitry communicates the resulting sample stream (SS) to the controller 225.

The controller 225 operates to process the one or more acquired sample streams provided by the acquisition circuitry 215 and 220 to generate respective waveform data associated with one or more sample streams. That is, given desired time per division and volts per division display parameters, the controller 225 operates to modify or rasterize the raw data associated with an acquired sample stream to produce corresponding waveform data having the desired time per division and volts per division parameters. The controller 225 may also normalize waveform data having non-desired time per division, volts per division, and current per division parameters to produce waveform data having the desired parameters. The controller 225 provides the waveform data to the processing circuitry 230 for subsequent presentation on the display device 235.

The processing circuitry 230 comprises data processing circuitry suitable for converting acquired sample streams or waveform data into image or video signals, which are adapted to provide visual imagery (e.g., video frame memory, display formatting and driver circuitry, and the like). The processing circuitry 230 may include the display device 235 (e.g., built-in DSO display device) and/or provide output signals (e.g., via a video driver circuit) suitable for use by an external display device 235.

The processing circuitry 230 is optionally responsive to the controller 235 and the various parameters, such as vertical (e.g., volts per division) and horizontal (e.g., time per division) display parameters, as well as user interface imagery (e.g., user prompts, diagnostic information and the like). It will be appreciated by those skilled in the art that within the context of a data acquisition system utilizing many acquisition devices 215 and 220, it is not necessary to include display circuitry 230 and a display device 235 in each of the acquisition devices 215 and 220. Moreover, in the case of the acquisition circuitry comprising modules or cards inserted within a computing device, or arranged using a back plane, a single processing circuit 230 and display device 235 may provide an image processing function for any one (or more) of the acquisition circuits.

The controller 225 of FIG. 2 comprises a processor 240, support circuits 245, I/O circuitry 250 and memory 255. The processor 240 cooperates with conventional support circuitry 245, such as power supplies, clock circuits, cache memory, and the like, as well as circuit that assist in executing software routines stored in the memory 255. As such, it is contemplated that some of the process steps discussed herein as software processes may be implemented within hardware, for example, as circuitry that cooperates with the processor 240 to perform various steps. The controller 225 also contains input/output (I/O) circuitry 250 that forms an interface between the various function elements communicating with the controller 225. For example, the I/O circuitry 250 may comprise a keypad, pointing device, touch screen, or other means adapted to provide user input and output to the controller 225. The controller 225, in response to such user input, illustratively adapts the operations of the acquisition circuitry 215 and 220 to perform various data acquisitions, triggering, processing, display communications, among other functions. In addition, the user input may be used to trigger automatic calibration functions and/or adapt other operating parameters of the display device 235, logical analysis, or other data acquisition devices.

The memory 255 may include volatile memory, such as SRAM, DRAM, among other volatile memories. The memory 250 may also include non-volatile memory devices, such as a disk drive or a tape medium, among others, or programmable memory, such as an EPROM, among others. The memory 255 stores the power-measurement program tool 260 of the present invention, which includes a peak finder tool 262 and a switching finder tool 264, as discussed below in further detail with respect to FIGS. 5–8.

Although the controller 225 of FIG.2 is depicted as a general purpose computer that is programmed to perform various control functions in accordance with the present invention, the invention may be implemented in hardware such as, for example, an application specific integrated circuit (ASIC). As such, it is Intended that the processor described herein be broadly interpreted as being equivalently performed by hardware, software, or a combination thereof.

It will be appreciated by those skilled in the art that standard signal processing components (not shown), such as signal buffering circuitry, signal conditioning circuitry, and the like are also employed as required to enable the various functions described herein. For example, the voltage acquisition circuitry 215 and current acquisition circuitry 220 sample the signals under test at a sufficiently high rate to enable appropriate processing by the controller 225 and/or the processing circuitry 230.

Figure 3:
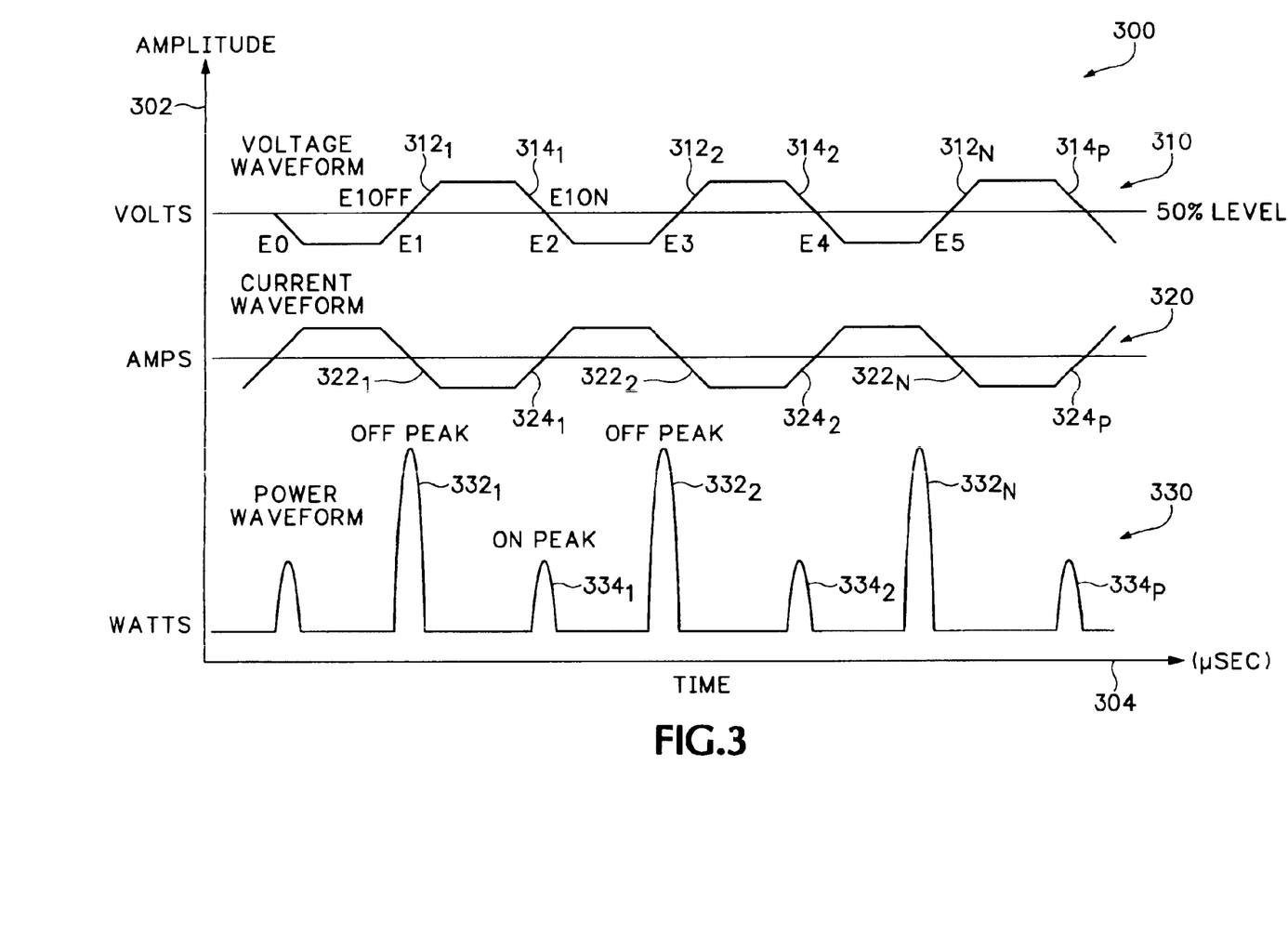
FIG. 3 depicts a graphical representation of voltage, current, and power. waveform data as measured by the oscilloscope of FIG. 2.

FIG. 3 depicts a graphical representation of voltage, current, and power waveform data 310, 320, and 330 as measured by the oscilloscope 130. In particular, the graphical representation 300 may be displayed on the display device 235, and comprises an ordinate 302 representing the amplitude (i.e., volts, amps, and watts) of the waveforms, and an abscissa 304 representing time (e.g., microseconds). The exemplary waveform data 310, 320, and 330 depicts exemplary voltage, current, and power waveforms illustratively formed between the drain and source of the NMOS switch 120 of the switching power supply of FIG. 1.

It is noted that when a switching device 120 is turned on, the voltage across the switching device (switching voltage) falls to saturation voltage, and when the switching device 120 is turned off, the switching voltage rises to the operating voltage. Similarly, when the switching device 120 is turned on, the current waveform increases to the operating current, and when the switching device 120 is turned off, the current waveform falls to the leakage current level. The graphical representations of the voltage current and power waveforms illustratively displayed on the display device 235 of the oscilloscope 130 by coupling the voltage and current probes 205 and 210 across the drain and source of the NMOS transistor switching device 120 of the switching power supply 101. As discussed above with respect to FIG. 2, the processing circuitry 230 samples the analog signal from the switching device 120 and forms the digital representation of the signal as a frame having a plurality of cycles, which form a record of the waveforms. Typically, the oscilloscope 130 is set to store a large record (i.e., hundreds of thousands) of switching cycles.

The peak finder tool 262 may be used to identify edges on the voltage waveform data 310 by determining the rising and falling slopes on the waveform. It is noted that the voltage waveform is illustratively measured at the fifty (50) percent level of the voltage waveform. That is, E1, E2, E3, E4, and E5 are edges at the 50 percent level of the voltage waveform, where E2 and E4 represent falling edges occurring during switching device turn on, while E1 and E3 represent rising edges occurring during the switching device turnoff.

It is noted that the wave shape of the current waveform depends on the reactance of type of output load inductance and capacitance. However, it is assumed that the voltage wave shape is consistent and swings from saturation voltage (low) to the switching voltage (high). Furthermore, the rise time and fall time preferably have a minimum of three samples between 10 percent and 90 percent to help establish the waveform maximum and minimum points.

Figure 4:
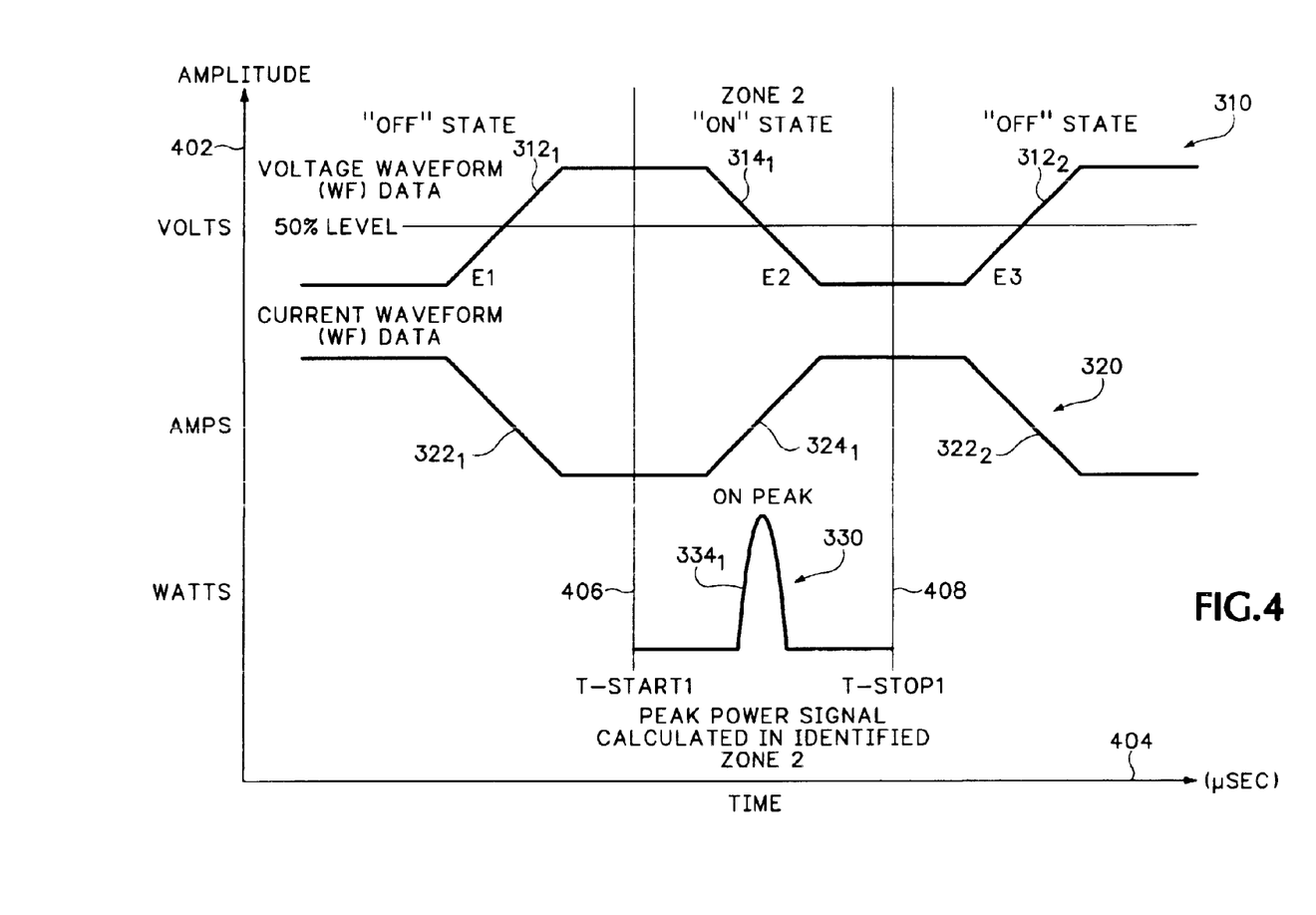
FIG. 4 depicts an exploded view of the graphical representation of the voltage, current, and power waveform data of FIG. 3.

FIG. 4 depicts an exploded view of the graphical representation of the voltage, current, and power waveform data 310, 320, and 330 of FIG. 3. The ordinate 402 represents the amplitude of the waveforms in Volts, Amps, and Watts for the respective voltage waveform, current waveform, and power waveform. The abscissa 404 represents time, illustratively in micro- or nanoseconds. The zoomed-in graphical representation 400 of FIG. 4 illustratively shows at least one zoomed-in switching cycle selected from the plurality of cycles of the waveforms of FIG. 3. As shown in FIG. 4, edges E1, E2, and E3 of FIG. 3 are zoomed-in and displayed on the display device 235 of the oscilloscope 130. Each edge represents either an on-state or off-state of the switching device.

For example, first rising edge E1 $312_1$, of the voltage waveform data 310 and first declining edge $322_1$, of the current waveform data 320 depict an off-state of the switching device 120. The first declining E2 $314_1$ of the voltage waveform data 310 and first rising edge $324_1$ of the current waveform data 320 together depict an on-state of the switching device 120. Furthermore, the second rising edge E3 $312_2$ of the voltage waveform data 310 and second declining edge $322_2$ of the current waveform data 320 illustrates a second off-state of the switching device 120, and so on. Details of how the illustrative "zoom-in" graphical representation of FIG. 4 are discussed below in further detail with respect to FIGS. 5–8. It is noted that the "zoom" feature may be implemented as a user controlled feature.

FIG. 4 depicts a portion of the waveform as within a "zone-2" region. As depicted in FIG. 4, zone 2 is delineated by a start time T-start 1 and a stop time T-stop 1 representing a portion of an OFF to ON transition. In an alternate embodiment, the specific zone is may be narrowed to represent only that portion of the waveform in which one or both of the current and voltage waveform data are not at a steady high or low state. Thus, in the alternate embodiments, zone 2 comprises a time T-start 1 beginning at the earliest of the downward voltage waveform slope 314, and the upward current waveform slope $324_1$, and a time T-stop located at the latest of the downward voltage waveform slope $314_1$ and the current waveform upward slope $324_1$. In this manner, analysis time is conserved by preferably focusing the analysis only for the portion of the transition data, as opposed to the entire waveform in the record.

Figure 5:
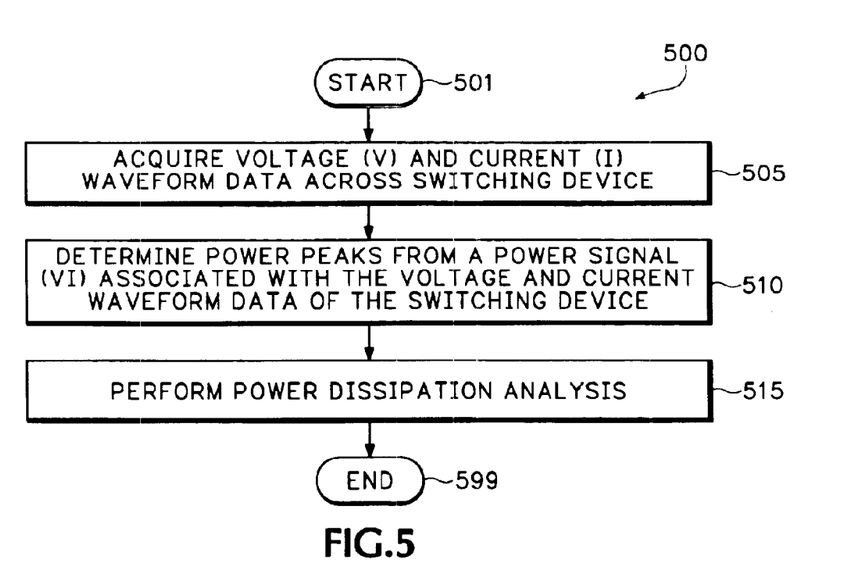
FIG. 5 depicts a flow-diagram of a method for identifying and analyzing high power dissipation peaks across a switching device of the exemplary switching power supply of FIG. 1.

FIG. 5 depicts a flow-diagram of a method 500 of identifying and analyzing high power dissipation peaks across a switching device 120 of the exemplary switching power supply 101 of FIG. 1. The method 500 starts at step 501, where the exemplary oscilloscope 130 of the present Invention is coupled across a switching device 120, such as the NMOS transistor via probes $132_1$ and $132_2$ as illustratively shown in FIG. 1. The method 500 then proceeds to step 505.

At step 505, the oscillscope 130 acquires the voltage and current waveform data across the switching device 120. In particular, the oscilloscope 130 converts the analog switching signals from the switching device 120 into a digital representation by sampling, optionally decimating, and storing a plurality of voltage and current waveform data cycles, as discussed with respect to FIG. 2, and illustratively shown In FIG. 3. The voltage and current waveform data cycles that are stored by the DSO form an historical record as the switching device 120 transitions between an on and off states. The number of cycles stored (i.e., the historical record) may be set by an operator in a range of a single cycle to hundreds of cycles. The record may be continuous or temporally proximate to a trigger event. The method 500 then proceeds to step 510.

At step 510, the power measurement program tool 260 of the present invention determines the power peaks from a power signal, which is computed from the voltage and current waveform data. In particular, the power measurement program tool 260 identifies the edges from the voltage waveform data by measuring both rising and falling slopes of the voltage waveform data, and determines a "zone" in each cycle representing switched "ON" and switch "OFF" transitions of the voltage waveform data for each cycle of the voltage waveform data. The method 500 then proceeds to step 515, At step 515, power dissipation analysis may be performed by a circuit designer using the power measuring tool 260 of the present invention. That is, peak power signal index and values may be calculated from the identified zones across the plurality of cycles. Once the analysis has been completed, the method 500 proceeds to step 599, where method 500 ends.

Figure 6:
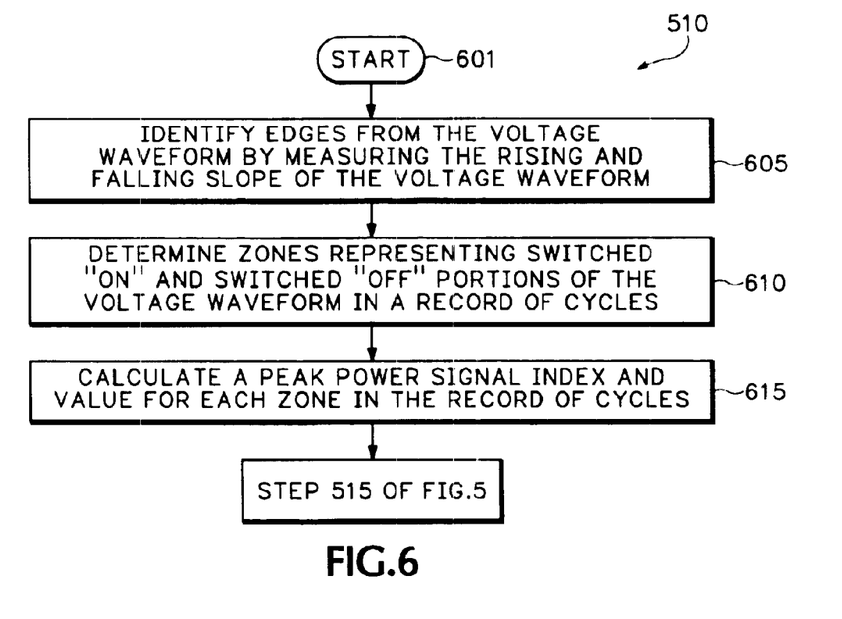
FIG. 6 depicts a flow-diagram of a method for determining power peaks on a power signal associated with voltage and current waveform data of the method of FIG. 5.

FIG. 6 depicts a flow-diagram of a method 510 of determining power peaks on a power signal associated with voltage and current waveform data across the switching device 120. In particular, method 510 starts at step 601 and proceeds to step 605, where voltage waveform data associated with the switching device 120 is processed to determine switching edge and slope parameters of each of a plurality of switching cycles. That is, the rising and falling edges from the voltage waveform are identified on the voltage waveform data 310. Recall that each transition between an "ON" state and "OFF" state of this switching device 120 forms an edge in the voltage waveform data 310 having a declining slope when the switching device 120 is turned on, and a rising slope when the switching device 120 is turned off.

In one embodiment of the invention, both the rising and falling edges of the voltage waveform are determined using the voltage waveform data directly. In this embodiment, the current waveform is also used in step 610 (discussed below) to establish the zones.

Referring to FIG. 3, edge E1 $312_1$ has a rising slope indicating that the switching device 120 is turning off, while edge E2 $314_1$ has a declining slope indicating that the switching device 120 is being turned on. Accordingly, the power management program tool 260 tracks changes in the slope of the voltage waveform data 310 to determine the beginning and end of each transition (i.e., edge). As discussed above, a plurality of consecutive cycles representing the voltage waveform data 310 are stored in a buffer (not shown) having a predetermined record length to provide historical information for viewing. Accordingly, data useful in defining the temporal location at the edges are identified for each of the cycles stored in the buffer therein. The method then proceeds to step 610.

At step 610, the zones In the waveform data associated with consecutive "ON" and "OFF" switch state transitions are identified for the plurality of switching cycles. Referring to FIG. 4, exemplary zone 2 is identified for the on-state transition defined by edge E2 $314_1$ of the voltage waveform data 310 and the rising edge $324_1$ of the current waveform data 320. The exemplary zone 2 is defined by a first vertical cursor 406 indicating a start index T-start 1 at the beginning of the second edge E2 $314_1$ and a second cursor 408 indicating a stop index T-stop 1 located at the end of the second transition E2 $314_1$ of the voltage waveform data 310.

It is noted that the vertical cursors 406 and 408 are a feature of the DSO 130 that allow a user to identify a particular area of a waveform. It is further noted that the start and stop indexes and also coincide with the beginning and end of the on-state current waveform data transition $324_1$. Although not shown in FIG. 4, one skilled in the art will appreciate that other zones may also be defined by the first and second vertical cursors 406 and 408 in a similar manner. Thus, the identified zone defines a portion of the plurality of switch cycles in which a peak power signal may be calculated from the voltage waveform data 310 and the current waveform data 320. The method then proceeds to step 615.

At step 615, a peak power signal index and value is calculated for each zone in the record (stored history) of switching cycles. That is, peak power levels are calculated by the power-measurement program 260 for a respective plurality of the identified switch state transitions using portions of the voltage waveform data 310 temporally corresponding to the plurality of identified switch state transitions, and portions of the current waveform data 320 associated with the switching device 120 and temporally corresponding to the identified switch state transitions. Referring to FIG. 3, each switch state transition (i.e., edge) has an associated peak power level shown below the respective transitions of the voltage waveform data and current waveform data 310 and 320. In the illustrative embodiment shown In FIG. 3, when the switch device 120 is transitioning to an off state, generally it is observed that the peak power is greater than when peak power of the switching device 120 is transitioning in an "ON" state. Accordingly, the peak power values from the voltage and current waveform data 310 and 320 can be quickly and automatically identified for display and analysis, for example, by the circuit designer.

For example, referring to FIG. 3, OFF Peak and ON Peak labeling is respectively provided for power peaks in the off and on states. The method 510 then proceeds to step 515 of FIG. 5. Referring to FIG. 5, power dissipation analysis may be performed by a circuit designer or other user. Two alternative methods are illustratively discussed with respective FIGS. 7 and 8. The method then proceeds to step 599 where the method 500 ends.

Figure 7:
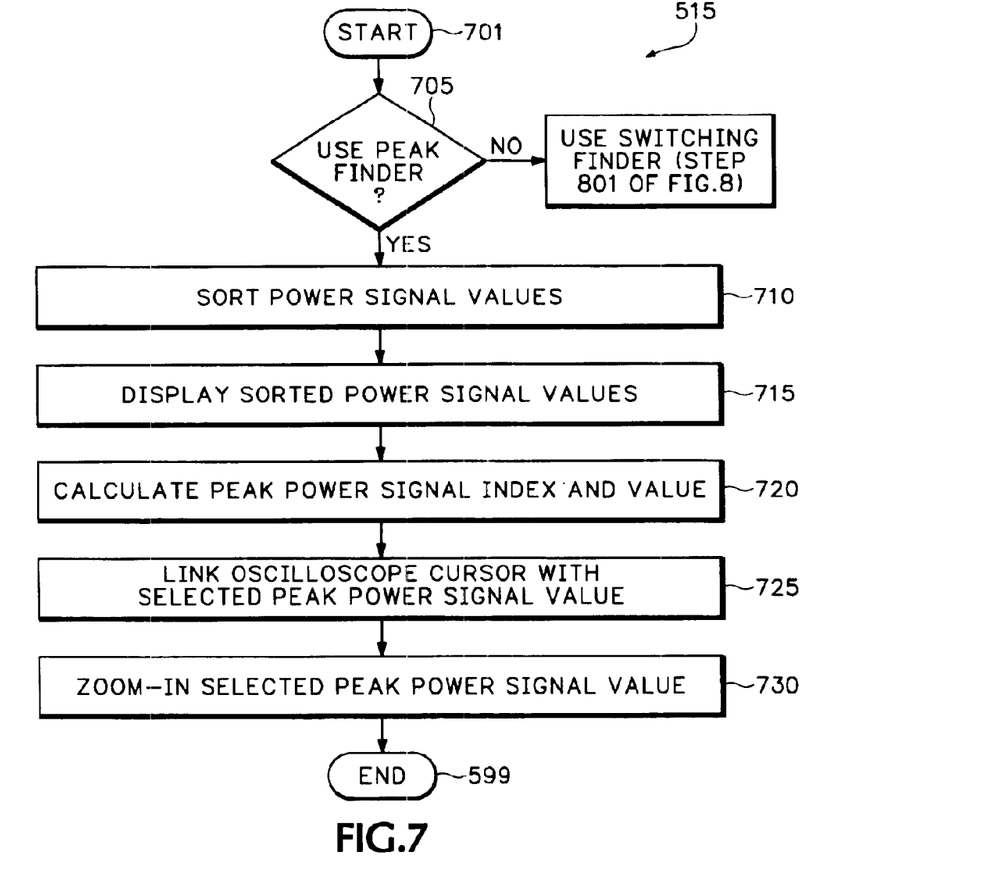
FIG. 7 depicts a flow diagram of a first method for performing power dissipation analysis of the method of FIG. 5.

FIG. 7 depicts a flow diagram of a first method 700 of performing power dissipation analysis using the peak finder module 262 of the present invention. The power measurement program 260 of the present invention comprises two analysis tools that enable the circuit designer to identify and analyze the voltage current and power waveform data across a particular element of a circuit such as the switching device of the switching circuit 101 of FIG. 1.

Figure 8:
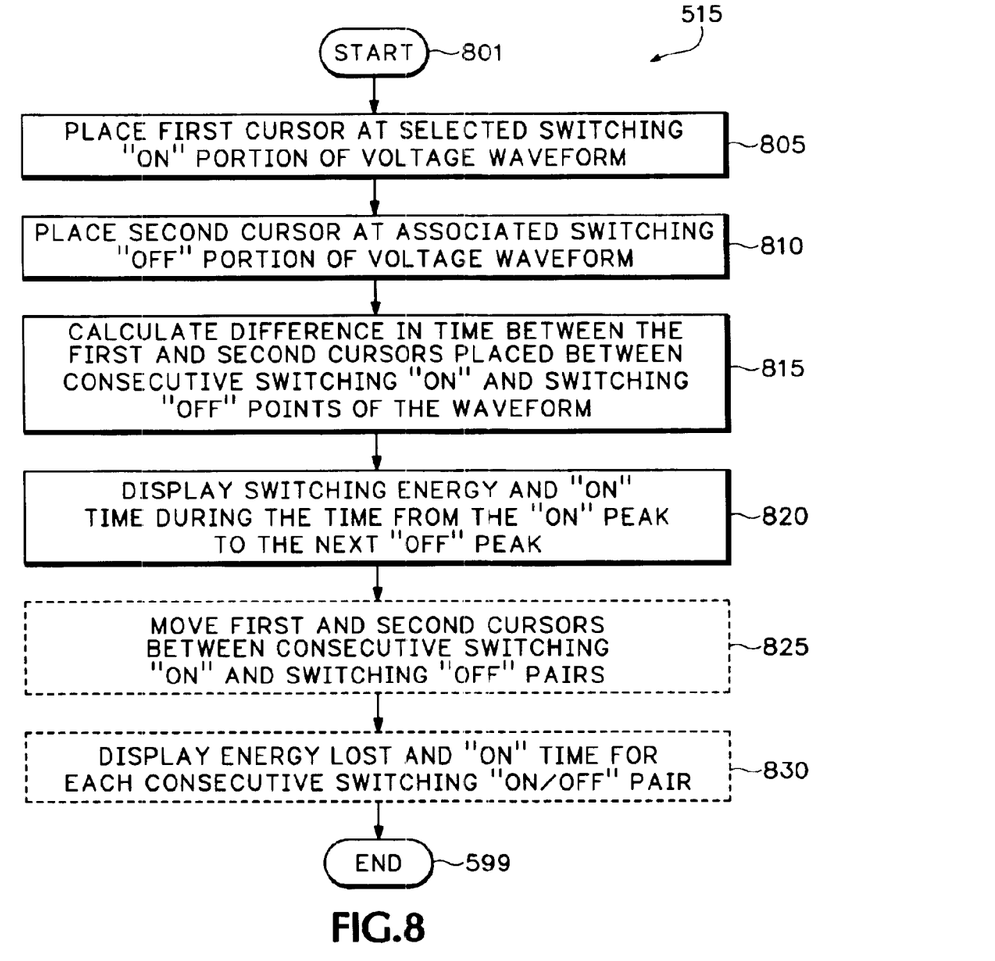
FIG. 8 depicts a flow diagram of a second method for performing power dissipation analysis of the method of FIG. 5.

FIG. 7 depicts a first method 515 for analyzing a circuit using a peak finder tool 262 of the present invention, while FIG. 8 depicts a second method for analyzing a circuit using the switching finder tool 264 of the present invention.

Referring to FIG. 7, the method 515 starts at step 701 and proceeds to step 705 where a circuit designer selects one of the analysis tools 262 or 264 to perform a circuit analysis. If at step 705, the circuit designer wants to perform circuit analysis by using the switching finder tool 264, the method proceeds to step 801 of FIG. 8. If at step 705 the circuit designer wishes to use the peak finder tool 262 of the present invention, the method 505 proceeds to step 710.

At Step 710, the peak finder tool sorts the power signal values illustratively in descending order, and at step 715, the sorted power signals are displayed to the circuit analyzer. At step 720, the peak finder tool 262 calculates the peak power signal index and value from the selected zone. It is noted that the peak finder tool 262 also allows a circuit analyzer to selectively sort the power values between selective power ranges entered by the circuit analyzer. The method then proceeds to step 720.

At step 725, the circuit analyzer optionally links the oscilloscope cursor with a selected peak power signal value. The oscilloscope cursor allows the circuit analyzer to select and concentrate on a particular power range on the plurality of cycles stored in the record (i.e., buffer). It is noted that in one embodiment, each of the power peaks of the power waveform data 330 is tagged internally by the peak finder tool 266 to indicate whether the peak was formed during an on-state or off-state of the switching device 120. Referring to FIG. 3, it is noted that the power peak $332_1$, is tagged with an "off peak" label, while power peak $334_1$ is tagged with an "on peak" label, and so forth. Such tags are not displayed to the circuit analyzer. However, one skilled in the art will appreciate that in an alternative embodiment, such labels may be displayed to assist a circuit analyzer in positioning the cursor to particular portion of the power waveform data 330 that the circuit analyzer wishes to review.

At step 730, the circuit analyzer optionally zooms in the selected peak power signal value. The zoom feature on the oscilloscope expands the horizontal image portion proximate the cursor associated with the waveform, as illustratively shown in FIG. 4. The method 515 then proceeds to step 599 where the method 500 ends.

FIG. 8 depicts a flow diagram of a second method 515 of performing power dissipation analysis of the method 500 of FIG. 5. Specifically, the circuit analyzer may wish to utilize the switching finder tool 264 of the present invention, as opposed to the peak finding tool 262. The switching finder tool 264 may be used to identify the switching portion of the power waveform data 330. It is noted that a switching device 120 is defined as being in an on-state during the time between an on-peak and a subsequent off-peak of a cycle. Similarly, the switching device 120 is said to be in an off-state during the time between an offpeak and a subsequent on-peak of a cycle. Each of these regions has one complete switching cycle of turning on and off. The calculated peaks and associated tag information (i.e., off-peak and on-peak labels) is used for identifying one complete switching cycle.

Two vertical cursors are available for user interface on the oscilloscope 130. Referring to FIG. 4, a first cursor 406 and a second cursor 408 are illustratively shown. Referring to FIG. 8, a first cursor 406 is placed at a selected switching on portion of the voltage waveform, while at step 810 the second cursor 408 is placed at an associated "switching-off" portion of the voltage waveform data 310. At step 815, the on-time and switching energy is calculated for the time between on-peak to next off-peak of the selected switching cycle. Specifically, the difference in time between the first and second cursors as between the consecutive switching on and switching off points of the waveform is calculated. At step 820, the energy and on-time from the on-peak to the next off-peak is displayed on the display device 235 of the oscilloscope 130. The method then proceeds to optional steps 825 and 830.

At optional step 825, the circuit analyzer may wish to view another portion of the waveform data, and move the first and second cursors 406 and 408 between consecutive switching on and switching off pairs. Thus, the oscilloscope 130 of the present invention gives the circuit analyzer the flexibility to analyze other switching on cycles. At optional step 830, the energy and ontime for each consecutive switching on-off pair is displayed on the display device 235. The method then proceeds to step 599, where the method 515 ends.

Accordingly, the power measurement program tool of the present invention may be utilized by circuit designers to improve the efficiency of switching power supplies with increased power densities. That is, designers need to analyze power dissipation and characterize transitions at higher switching frequencies. Using TDSPWR2's unique switching loss features, designers can measure switching device power dissipation, efficiently, and accurately characterize switching waveforms and measure power loss at the switching device.

More specifically, the power measurement software tool 260 illustratively transforms a digital oscilloscope 130 into a sophisticated analysis tool that quickly measures and analyzes power dissipation in power supply switching devices and magnetic components, and then generates detailed test reports in customizable formats.

Although various embodiments that incorporate the teachings of the present invention have been shown and described in detail herein, those skilled in the art can readily devise many other varied embodiments that still incorporate these teachings.

What is claimed is:

1. A method, comprising the steps of:
    processing voltage waveform data associated with a switching device to determine switching edge and slope parameters for each of a plurality of switching cycles;
    identifying those portions of said voltage waveform data associated with switch state transition portions of said plurality of switching cycles;
    calculating, for a plurality of said identified switch state transition portions, respective peak power levels using portions of said voltage waveform data temporally corresponding to said plurality of identified switch state transitions, and portions of current waveform data associated with said switching device temporally corresponding to said plurality of identified switch state transitions.

2. The method of claim 1, further comprising the step of:

identifying those switch state transition portions associated with peak power level excursions beyond at least one threshold level representing a range of peak power values used for sorting said peak power level excursions.

3. The method of claim 1, further comprising the step of:

displaying imagery representing power levels associated with at least some of said plurality of identified switch state transition portions of said switching cycles.

4. The method of claim 2, further comprising the step of:

displaying imagery representing power levels associated with at least some of said plurality of identified switch state transition portions of said switching cycles, wherein said switch state transition portions having associated with them peak power level excursions beyond a first threshold level are emphasized by at least one of a luminance parameter, a chrominance parameter and an icon.

5. The method of claim 3, further comprising the step of:

associating a first cursor with a switch on transition and associating a second cursor with a corresponding switch off transition; and calculating at least one of an energy parameter and a time parameter associated with waveform data bounded by said first and second cursors.

6. The method of claim 5, further comprising the steps of:

moving, in response to user iteration, said first and second cursors between consecutive pairs of corresponding switch on and switch off transitions; and calculating at least one of an energy parameter and a time parameter associated with waveform data bounded by said first and second cursors at least one of said consecutive pairs of corresponding switch on and switch off transitions.

7. The method of claim 3, further comprising the steps of:

associating a cursor with a user selected peak power signal value; and calculating at least one of a peak power signal index and a peak power signal value within a zone proximate said selected peak power signal value.

8. The method of claim 7, further comprising the step of:

adapting a size parameter of said zone in response to user interaction.

9. The method of claim 1, further comprising the step of:

acquiring said voltage and current waveform data via respective acquisition channels of a signal processing device.

10. The method of claim 9, wherein said signal processing device comprises one of a digital storage oscilloscope (DSO) and a data acquisition module in communication with a computing device.

11. An apparatus, comprising:

means for processing voltage waveform data associated with a switching device to determine switching edge and slope parameters for each of a plurality of switching cycles;

means for identifying those portions of said voltage waveform data associated with switch state transition portions of said plurality of switching cycles;

means for calculating, for a plurality of said identified switch state transition portions, respective peak power levels using portions of said voltage waveform data temporally corresponding to said plurality of identified switch state transitions, and portions of current waveform data associated with said switching device temporally corresponding to said plurality of identified switch state transitions.

12. The apparatus of claim 11, further comprising:

means for identifying those switch state transition portions associated with peak power level excursions beyond at least one threshold level representing a range of peak power values used for sorting said peak power level excursions.

13. The apparatus of claim 11, further comprising:

means for displaying imagery representing power levels associated with at some of said plurality of identified switch state transition portions of said switching cycles.

14. The apparatus of claim 12, further comprising:

means for displaying imagery representing power levels associated with at some of said plurality of Identified switch state transition portions of said switching cycles, wherein said switch state transition portions having associated with them peak power level excursions beyond a first threshold level are emphasized by at least one of a luminance parameter, a chrominance parameter and an icon.

15. The apparatus of claim 13, further comprising:

means for associating a first cursor with a switch-on transition and associating a second cursor with a corresponding switch-off transition; and means for calculating at least one of an energy parameter and a time parameter associated with waveform data bounded by said first and second cursors.

16. The apparatus of claim 15, further comprising:

means for moving, in response to user iteration, said first and second cursors between consecutive pairs of corresponding switch on and switch off transitions; and means for calculating at least one of an energy parameter and a time parameter associated with waveform data bounded by said first and second cursors at least one of said consecutive pairs of corresponding switch on and switch off transitions.

17. The apparatus of claim 13, further comprising:

means for associating a cursor with a user selected peak power signal value; and means for calculating at least one of a peak power signal index and a peak power signal value within a zone proximate said selected peak power signal value.

18. The apparatus of claim 17, further comprising:

means for adapting a size parameter of said zone in response to user interaction.

19. The apparatus of claim 11, further comprising:

means for acquiring said voltage and current waveform data via respective acquisition channels of a signal processing device.

20. The apparatus of claim 19, wherein said signal processing device comprises one of a digital storage oscilloscope (DSO) and a data acquisition module in communication with a computing device.

* * * * *